(12) United States Patent
Punzalan et al.

(10) Patent No.: US 8,399,968 B2
(45) Date of Patent: Mar. 19, 2013

(54) NON-LEADED INTEGRATED CIRCUIT PACKAGE SYSTEM

(75) Inventors: Jeffrey D. Punzalan, Singapore (SG); Henry D. Bathan, Singapore (SG); Il Kwon Shim, Singapore (SG)

(73) Assignee: Stats Chippac Ltd., Singapore (SG)

( * ) Notice: Subject to any disclaimer, the term of this patent is extended or adjusted under 35 U.S.C. 154(b) by 178 days.

(21) Appl. No.: 11/164,335

(22) Filed: Nov. 18, 2005

(65) Prior Publication Data
US 2007/0114650 A1     May 24, 2007

(51) Int. Cl.
*H01L 23/495* (2006.01)

(52) U.S. Cl. .............. 257/676; 257/666; 257/E33.066; 438/123

(58) Field of Classification Search .......... 257/796, 257/773, 666, 676
See application file for complete search history.

(56) References Cited

U.S. PATENT DOCUMENTS

| | | | |
|---|---|---|---|
| 5,475,606 A * | 12/1995 | Muyshondt et al. | 716/19 |
| 6,515,861 B1 * | 2/2003 | Andric et al. | 361/709 |
| 6,661,083 B2 | 12/2003 | Lee et al. | |
| 6,717,824 B2 | 4/2004 | Miyajima et al. | |
| 6,833,609 B1 | 12/2004 | Fusaro et al. | |
| 6,838,751 B2 | 1/2005 | Cheng et al. | 257/666 |
| 6,867,071 B1 * | 3/2005 | Lee et al. | 438/123 |
| 6,867,072 B1 | 3/2005 | Shiu et al. | 438/123 |
| 6,876,068 B1 * | 4/2005 | Lee et al. | 257/676 |
| 6,876,069 B2 | 4/2005 | Punzalan et al. | |
| 6,882,037 B2 | 4/2005 | Lin et al. | 257/690 |
| 6,903,448 B1 | 6/2005 | Sutardja et al. | 257/666 |
| 6,917,097 B2 | 7/2005 | Chow et al. | 257/666 |
| 6,965,157 B1 | 11/2005 | Perez et al. | |
| 6,995,459 B2 | 2/2006 | Lee et al. | |
| 7,211,887 B2 | 5/2007 | Channabasappa et al. | |
| 2003/0127711 A1 * | 7/2003 | Kawai et al. | 257/666 |
| 2004/0238921 A1 | 12/2004 | Lee et al. | |
| 2005/0236701 A1 | 10/2005 | Minamio et al. | |
| 2006/0006510 A1 | 1/2006 | Koduri | |
| 2006/0033184 A1 | 2/2006 | Park et al. | |
| 2007/0281392 A1 * | 12/2007 | Yee et al. | 438/111 |

OTHER PUBLICATIONS

Merriam-Webster's Collegiate Dictionary, Tenth Edition, Merriam-Webster, Inc, Springfield, MA, 2001; p. 473.*
Chen, Nansen. Electrical Design and Manufacturing Evaluation for Multiple Exposed Pads (M-pad) Leadframe Package. Aug. 2007. International Symposium on High Density Packaging and Microsystems Integration 2007 (HDP'07), pp. 1-4.*

* cited by examiner

*Primary Examiner* — Ajay K Arora
(74) *Attorney, Agent, or Firm* — Ishimaru & Associates LLP

(57) ABSTRACT

A non-leaded integrated circuit package system is provided providing a die paddle of a lead frame, forming a dual row of terminals including outer terminal pads and inner terminal pads, and selectively fusing an extension between the die paddle and instances of the inner terminal pads.

20 Claims, 3 Drawing Sheets

NON-LEADED INTEGRATED CIRCUIT PACKAGE SYSTEM

TECHNICAL FIELD

The present invention relates generally to integrated circuit packages and more particularly to ground planes of integrated circuit packages.

BACKGROUND ART

Modern consumer electronics, such as cellular phones, digital cameras, and music players, are packing more integrated circuits into an ever shrinking physical space with expectations for decreasing cost. Numerous technologies have been developed to meet these requirements. Some of the research and development strategies focus on new package technologies while others focus on improving the existing and mature package technologies. Research and development in the existing package technologies may take a myriad of different directions.

Consumer electronics requirements demand more integrated circuits in an integrated circuit package while paradoxically providing less physical space in the system for the increased integrated circuits content. Continuous cost reduction is another requirement. Some technologies primarily focus on integrating more functions into each integrated circuit. Other technologies focus on stacking these integrated circuits into a single package. While these approaches provide more functions within an integrated circuit, they do not fully address the requirements for lower height, smaller space, and cost reduction.

One proven way to reduce cost is to use mature package technologies with existing manufacturing methods and equipments. Paradoxically, the reuse of existing manufacturing processes does not typically result in the reduction of package dimensions. As the integrated circuit content increases in a package, the input and output density increases. The input and output density increase also creates challenges for the printed circuit board. The design of the printed circuit board increases in complexity and congestion resulting from the increase in the input and output density of the package.

Thus, a need still remains for a non-leaded integrated circuit package system supporting higher input and output pin count while alleviating the demands on the printed circuit board designs. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides providing a die paddle of a lead frame, forming a dual row of terminals including outer terminal pads and inner terminal pads, and selectively fusing an extension between the die paddle and instances of the inner terminal pads.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
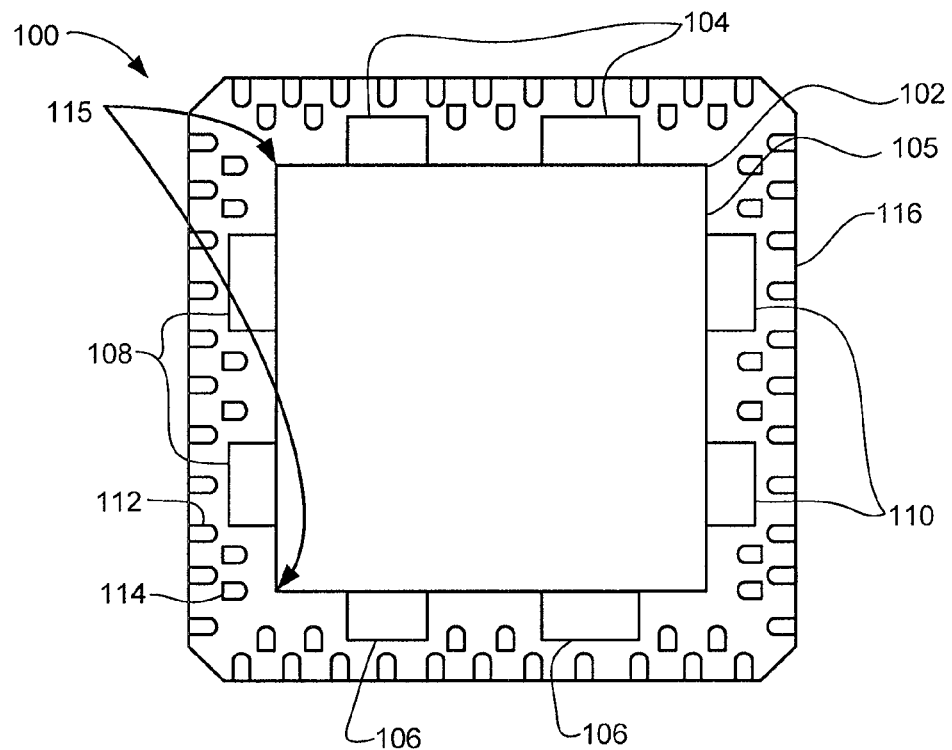
FIG. 1 is a bottom view of a non-leaded integrated circuit package system in an embodiment of the present invention.

In the following description, numerous specific details are given to provide a thorough understanding of the invention. However, it will be apparent that the invention may be practiced without these specific details. In order to avoid obscuring the present invention, some well-known system configurations, and process steps are not disclosed in detail. Likewise, the drawings showing embodiments of the apparatus are semi-diagrammatic and not to scale and, particularly, some of the dimensions are for the clarity of presentation and are shown greatly exaggerated in the figures. In addition, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the conventional integrated circuit surface, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

The term "processing" as used herein includes deposition of material, patterning, exposure, development, etching, cleaning, molding, and/or removal of the material or as required in forming a described structure.

Referring now to FIG. 1, therein is shown a bottom view of a non-leaded integrated circuit package system 100 in an embodiment of the present invention. The non-leaded integrated circuit package system 100 includes a die paddle 102, first-side extensions 104, second-side extensions 106, third-side extensions 108, fourth-side extensions 110, outer terminal pads 112, inner terminal pads 114, and an encapsulant 116. The die paddle 102 includes the extensions 104, 106, 108, or 110 extending orthogonally from peripheral sides 105. The die paddle 102 can have abutting instances of the peripheral sides 105 joining to form paddle corners 115 at opposing ends of each of the peripheral sides 105. The extensions 104, 106, 108, or 110 is between the paddle corners 115 at opposing ends of each of the peripheral sides 105. The die paddle 102 has the extensions 104, 106, 108, and 110 extending outward from the die paddle 102 between the inner terminal pads 114 and not extending between the outer terminal pads 112. The outer terminal pads 112 and the inner terminal pads 114 form the dual row of terminals for the non-leaded integrated circuit package system 100.

An integrated circuit die (not shown) mounts on the die paddle 102, wherein a predetermined dimension range of the length and the width of the integrated circuit die fits in the non-leaded integrated circuit package system 100. The length and width of the die paddle 102 along with the limitations of an electrical interconnect process, such as wire bonding, provide the predetermined dimension range of the integrated circuit die that may fit.

Electrical interconnects (not shown), such as bond wires, connect between integrated circuit die and the outer terminal pads 112 or the inner terminal pads 114, as required. The length of the electrical interconnects may determine the minimum length and width of the integrated circuit die. An increase in density of the inputs and outputs of the non-leaded integrated circuit package system 100 increases the density of the outer terminal pads 112 and the inner terminal pads 114 to minimize an increase in length and width of the non-leaded integrated circuit package system 100.

The increased input and output density may cause manufacturing yield problems for the electrical interconnect process, such as crossing of bond wires, and the printed circuit board (not shown) where the non-leaded integrated circuit package system 100 is mounted thereon. The printed circuit board design may need more traces routed to the outer terminal pads 112 and the inner terminal pads 114, as required. As the densities of the outer terminal pads 112 and the inner terminal pads 114 increases, the traces of the printed circuit board may become congested causing problems, such as decreased electrical performance and printed circuit board manufacturing yield.

The non-leaded integrated circuit package system 100 supports the increased density of the input and outputs while providing relief to the printed circuit board congestion. The die paddle 102 along with the first-side extensions 104, the second-side extensions 106, the fourth-side extensions 110, and the third-side extensions 108 may provide a common ground connection to the printed circuit board.

The first-side extensions 104, the second-side extensions 106, the fourth-side extensions 110, and the third-side extensions 108 provides additional ground bonding site for the integrated circuit die without the need for the printed circuit board to provide ground connections to the first-side extensions 104, the second-side extensions 106, the fourth-side extensions 110, and the third-side extensions 108. The additional bond sites to the ground plane may decrease the density of the electrical interconnects to connect between the integrated circuit die and the outer terminal pads 112 or the inner terminal pads 114. The decreased electrical interconnects density between the integrated circuit die to the outer terminal pads 112 and the inner terminal pads 114 decreases potential to cross the electrical interconnects resulting in a manufacturing yield improvement.

Multiple ground planes may be provided by the non-leaded integrated circuit package system 100. The die paddle 102, the first-side extensions 104, the second-side extensions 106, the fourth-side extensions 110, and the third-side extensions 108 may be tied to one ground plane, such as digital ground, while a different ground plane, such as analog ground, may be routed to the outer terminal pads 112 and the inner terminal pads 114, as required.

Alternatively, the printed circuit board may route ground to the selected sites of the first-side extensions 104, the second-side extensions 106, the fourth-side extensions 110, and the third-side extensions 108 instead of the die paddle 102, as well. The die paddle 102, the first-side extensions 104, the second-side extensions 106, the fourth-side extensions 110, and the third-side extensions 108 may be tied to one ground plane while not precluding the same ground plane to be routed to the outer terminal pads 112 and the inner terminal pads 114, as required.

The outer terminal pads 112 and the inner terminal pads 114 are staggered to ease the connections of the electrical interconnects between the integrated circuit die to the outer terminal pads 112 and the inner terminal pads 114 while mitigating the potential for electrical interconnects crossing, as required. The staggered arrangement may also be used to alleviate some of the printed circuit board congestion.

A lead frame (not shown), such as a metal lead frame, forms the die paddle 102 in a center region of the non-leaded integrated circuit package system 100. The first-side extensions 104, the second-side extensions 106, the fourth-side extensions 110, and the third-side extensions 108 extend from the die paddle 102 into the region of the inner terminal pads 114 without extending into the region of the outer terminal pads 112. Each instance of the first-side extensions 104, the second-side extensions 106, the fourth-side extensions 110, and the third-side extensions 108 cover an area of two instances of the inner terminal pads 114 such that the instances of the inner terminal pads 114 are depopulated. The first-side extensions 104, the second-side extensions 106, the fourth-side extensions 110, and the third-side extensions 108 may be formed by fusing the die paddle 102 to the instances of the inner terminal pads 114, as required.

The first-side extensions 104 may provide ground shielding for the signals of the inner terminal pads 114 between the instances of the first-side extensions 104. Similarly, the second-side extensions 106, the fourth-side extensions 110, and the third-side extensions 108 may provide ground shielding for the inner terminal pads 114 between the instances of the second-side extensions 106, the fourth-side extensions 110, and the third-side extensions 108, respectively. Instances of the inner terminal pads 114 are shown toward the corners of the non-leaded integrated circuit package system 100.

The encapsulant 116 surrounds the areas between the die paddle 102, the first-side extensions 104, the second-side extensions 106, the fourth-side extensions 110, the third-side extensions 108, the outer terminal pads 112, and the inner terminal pads 114. The encapsulant 116 exposes the die paddle 102, the first-side extensions 104, the second-side extensions 106, the fourth-side extensions 110, the third-side extensions 108, the outer terminal pads 112, and the inner terminal pads 114 for connection to the printed circuit board, as required. The encapsulant 116 also covers the integrated circuit die and the electrical interconnects.

For illustrative purposes, the die paddle 102 is shown as a square geometric shape, although it is understood that the geometric shape of the die paddle 102 may be other than a square, as well. Also for illustrative purposes, the first-side extensions 104, the second-side extensions 106, the fourth-side extensions 110, and the third-side extensions 108 are shown as a rectangular geometric shape, although it is understood that the geometric shape of the first-side extensions 104, the second-side extensions 106, the fourth-side extensions 110, and the third-side extensions 108 may be other than a rectangle, as well. Further for illustrative purposes, each instance of the first-side extensions 104, the second-side extensions 106, the fourth-side extensions 110, and the third-side extensions 108 are shown as depopulating two instances of the inner terminal pads 114, although it is understood that the number of instances of the inner terminal pads 114 depopulated may differ, as well.

Figure 2:
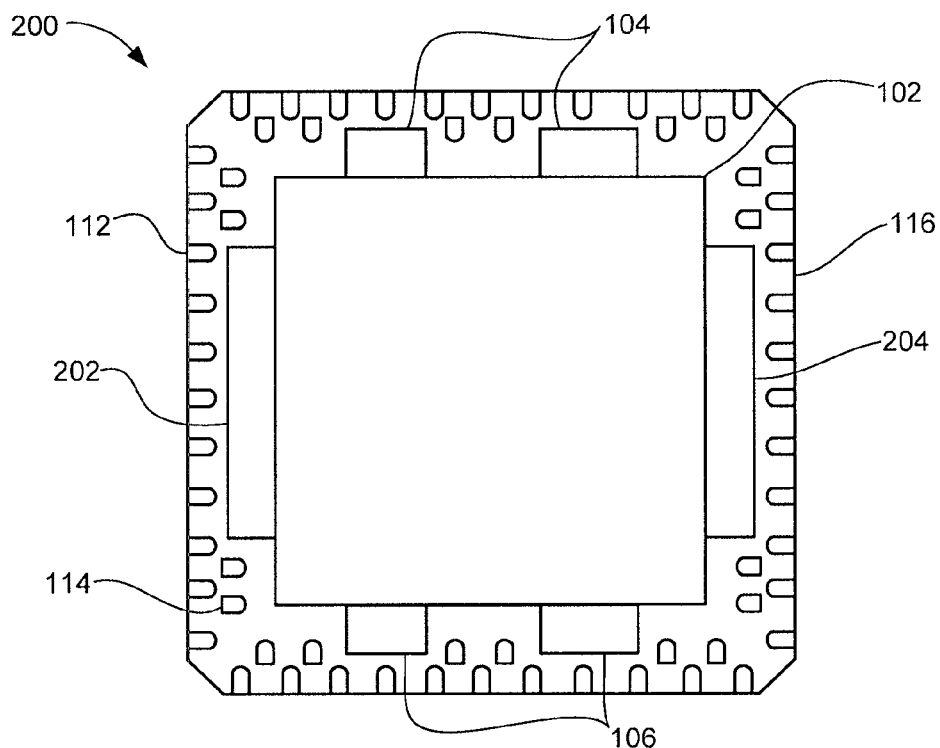
FIG. 2 is a bottom view of a non-leaded integrated circuit package system in an alternative embodiment of the present invention.

Referring now to FIG. 2, therein is shown a bottom view of a non-leaded integrated circuit package system 200 in an alternative embodiment of the present invention. Similar to the non-leaded integrated circuit package system 100, the non-leaded integrated circuit package system 200 includes the die paddle 102, the first-side extensions 104, the second-side extensions 106, the outer terminal pads 112, the inner terminal pads 114, and the encapsulant 116. The non-leaded integrated circuit package system 200 also includes a third-side extension 202 and a fourth-side extension 204. The third-side extension 202 and the fourth-side extension 204 may be formed by fusing the die paddle 102 to the instances of the inner terminal pads 114, as required.

The instances of the first-side extensions 104 and the second-side extensions 106 surround a number of the inner terminal pads 114. The instances of the inner terminal pads 114 are shown toward the corners of the non-leaded integrated circuit package system 200 beyond the first-side extensions 104 and the second-side extensions 106.

The third-side extension 202 extends from the die paddle 102 into the region of the inner terminal pads 114 without extending into the region of the outer terminal pads 112. The third-side extension 202 also covers an area of a number of the inner terminal pads 114 such that the instances of the inner terminal pads 114 are depopulated. The instances of the inner terminal pads 114 toward the corners of the non-leaded integrated circuit package system 200 surround the third-side extension 202.

For illustrative purposes, the third-side extension 202 is shown as a rectangular geometric shape, although it is understood that the geometric shape of the third-side extension 202 may be other than a rectangle, as well. Also for illustrative purposes, the third-side extension 202 is shown as contiguous, although it is understood that the third-side extension 202 may not be contiguous, as well.

Similarly, the fourth-side extension 204 extends from the die paddle 102 into the region of the inner terminal pads 114 without extending into the region of the outer terminal pads 112. The fourth-side extension 204 also covers an area of a number of the inner terminal pads 114 such that the instances of the inner terminal pads 114 are depopulated. The instances of the inner terminal pads 114 toward the corners of the non-leaded integrated circuit package system 200 surround the fourth-side extension 204.

For illustrative purposes, the fourth-side extension 204 is shown as a rectangular geometric shape, although it is understood that the geometric shape of the fourth-side extension 204 may be other than a rectangle, as well. Also for illustrative purposes, the fourth-side extension 204 is shown as contiguous, although it is understood that the fourth-side extension 204 may not be contiguous, as well.

Figure 3:
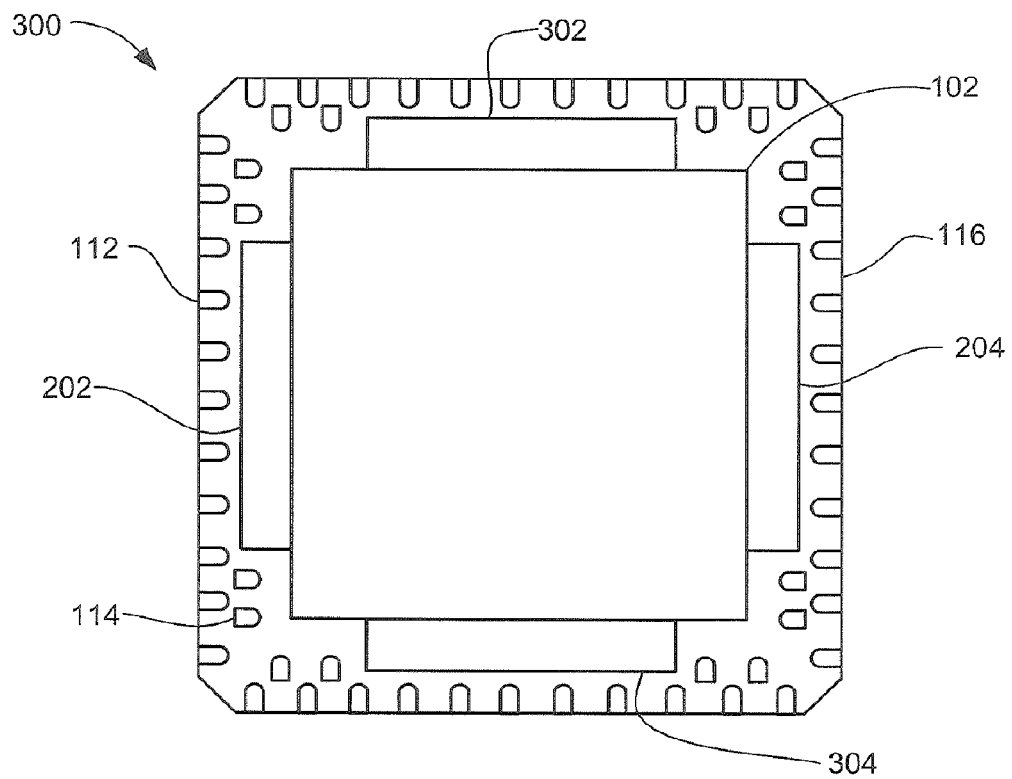
FIG. 3 is a bottom view of a non-leaded integrated circuit package system in another alternative embodiment of the present invention.

Referring now to FIG. 3, therein is shown a bottom view of a non-leaded integrated circuit package system 300 in another alternative embodiment of the present invention. Similar to the non-leaded integrated circuit package system 200, the non-leaded integrated circuit package system 300 includes the die paddle 102, the third-side extension 202, the fourth-side extension 204, the outer terminal pads 112, the inner terminal pads 114, and the encapsulant 116. The non-leaded integrated circuit package system 300 also includes a first-side extension 302 and a second-side extension 304. The instances of the inner terminal pads 114 are shown toward the corners of the non-leaded integrated circuit package system 200 surrounding the first-side extension 302 and the second-side extension 304. The first-side extension 302 and the second-side extension 304 may be formed by fusing the die paddle 102 to the instances of the inner terminal pads 114, as required.

The first-side extension 302 extends from the die paddle 102 into the region of the inner terminal pads 114 without extending into the region of the outer terminal pads 112. The first-side extension 302 also covers an area of a number of the inner terminal pads 114 such that the instances of the inner terminal pads 114 are depopulated. The instances of the inner terminal pads 114 toward the corners of the non-leaded integrated circuit package system 300 surround the first-side extension 302.

For illustrative purposes, the first-side extension 302 is shown as a rectangular geometric shape, although it is understood that the geometric shape of the first-side extension 302 may be other than a rectangle, as well. Also for illustrative purposes, the first-side extension 302 is shown as contiguous, although it is understood that the first-side extension 302 may not be contiguous, as well.

Similarly, the second-side extension 304 extends from the die paddle 102 into the region of the inner terminal pads 114 without extending into the region of the outer terminal pads 112. The second-side extension 304 also covers an area of a number of the inner terminal pads 114 such that the instances of the inner terminal pads 114 are depopulated. The instances of the inner terminal pads 114 toward the corners of the non-leaded integrated circuit package system 300 surround the second-side extension 304.

For illustrative purposes, the second-side extension 304 is shown as a rectangular geometric shape, although it is understood that the geometric shape of the second-side extension 304 may be other than a rectangle, as well. Also for illustrative purposes, the second-side extension 304 is shown as contiguous, although it is understood that the second-side extension 304 may not be contiguous, as well.

Figure 4:
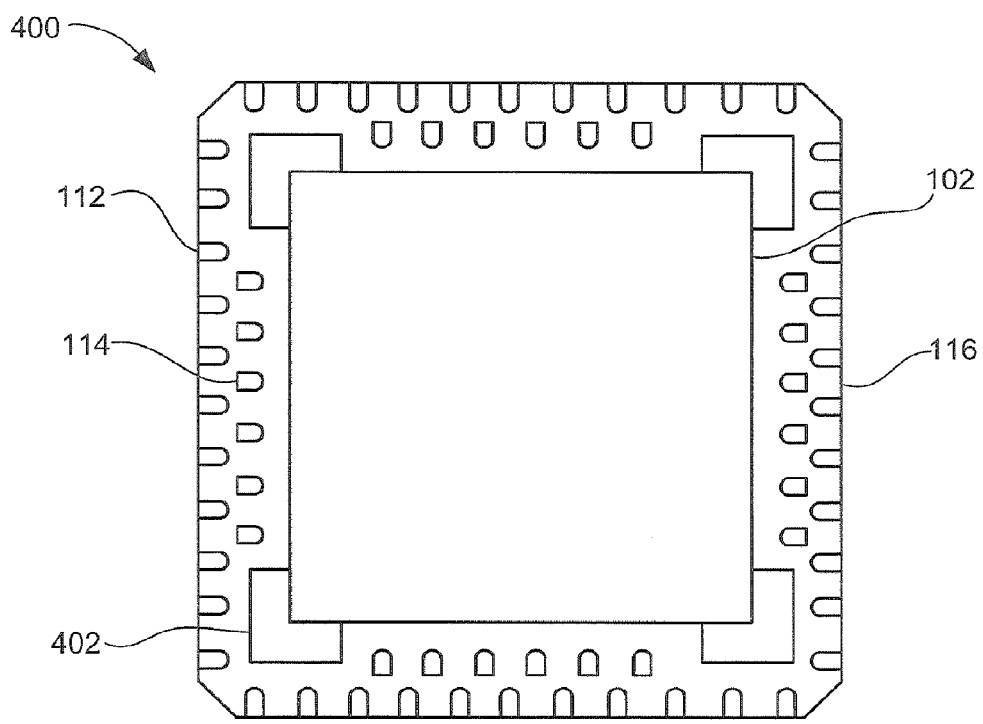
FIG. 4 is a bottom view of a non-leaded integrated circuit package system in yet another alternative embodiment of the present invention.

Referring now to FIG. 4, therein is shown a plan view of a non-leaded integrated circuit package system 400 in yet another alternative embodiment of the present invention. Similar to the non-leaded integrated circuit package system 100, the non-leaded integrated circuit package system 400 includes the die paddle 102, the outer terminal pads 112, the inner terminal pads 114, and the encapsulant 116. The non-leaded integrated circuit package system 400 also includes corner extensions 402. The corner extensions 402 may be formed by fusing the die paddle 102 to the instances of the inner terminal pads 114, as required. Other processes may be used to form the corner extensions 402, such as half etching.

The corner extensions 402 extend from the die paddle 102 into the region of the inner terminal pads 114 without extending into the region of the outer terminal pads 112. The corner extensions 402 also cover corner areas of a number of the inner terminal pads 114 such that the instances of the inner terminal pads 114 are depopulated. The corner extensions 402 of the non-leaded integrated circuit package system 300 surround the instances of the inner terminal pads 114.

For illustrative purposes, the corner extensions 402 are shown as a rectangular geometric shape, although it is understood that the geometric shape of the corner extensions 402 may be other than a rectangle, as well. Also for illustrative purposes, the corner extensions 402 are shown as contiguous, although it is understood that the corner extensions 402 may not be contiguous, as well. Further for illustrative purposes, the corner extensions 402 are shown substantially the same, although it is understood that the corner extensions 402 may differ, as well.

Figure 5:
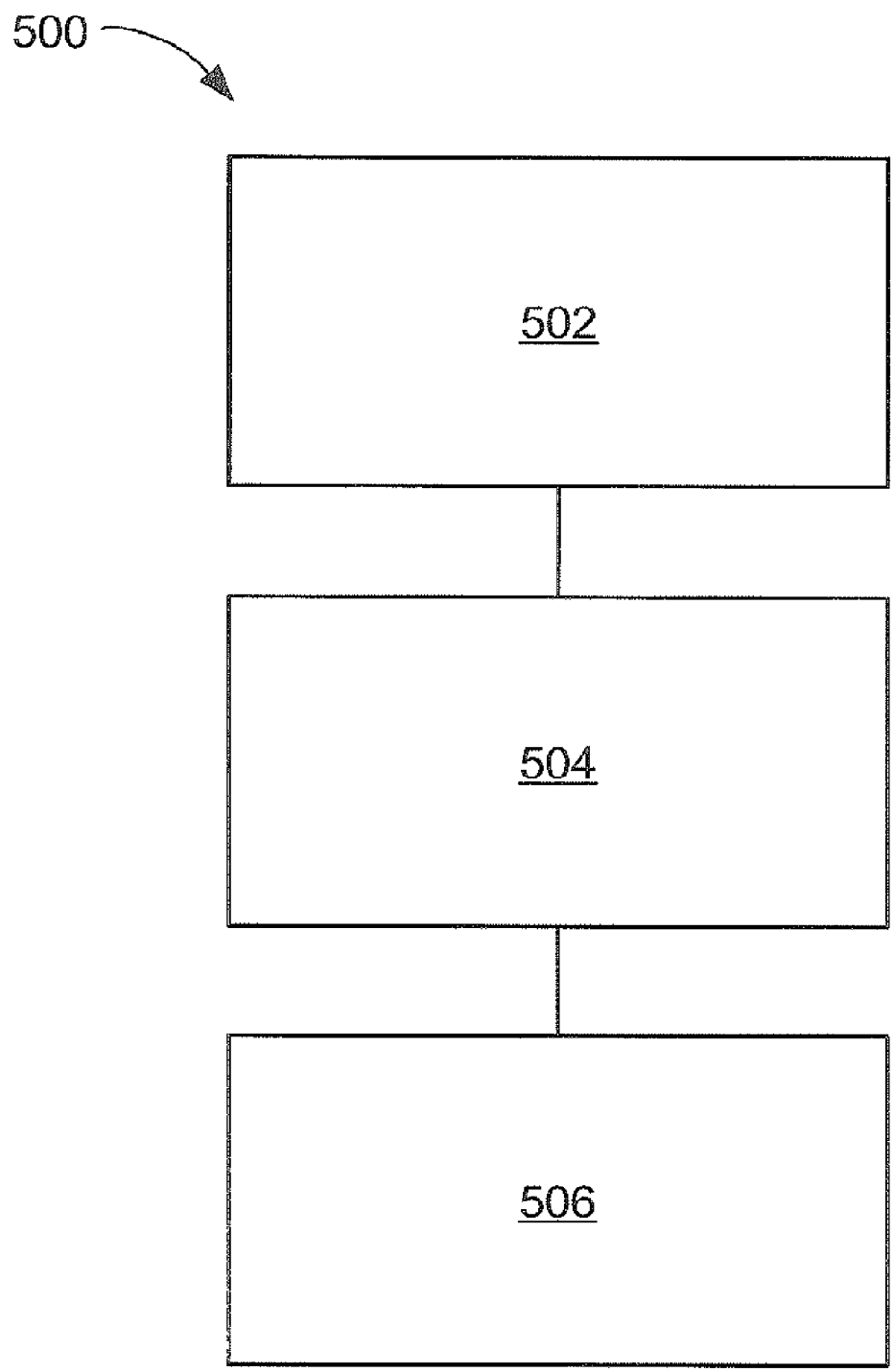
FIG. 5 is a flow chart of a non-leaded integrated circuit package system for manufacturing the non-leaded integrated circuit package system in an embodiment of the present invention.

Referring now to FIG. 5, therein is shown a flow chart of a non-leaded integrated circuit package system 500 for manufacturing the non-leaded integrated circuit package system 100 in an embodiment of the present invention. The system 500 includes providing a die paddle of a lead frame in a block 502; forming a dual row of terminals including outer terminal pads and inner terminal pads in a block 504; and selectively fusing an extension between the die paddle and instances of the inner terminal pads in a block 506.

It has been discovered that the present invention thus has numerous aspects.

It has been discovered that the selective forming extensions to the die paddle simplifies the design and improves manufacturing yield of the non-leaded integrated circuit package system. The design simplification and yield improvement also occurs to the printed circuit board that the non-leaded integrated circuit package system is mounted on.

An aspect is that the present invention provides variable and selectable extensions to the die paddle as required through the use of a number of processes, such as fusing and half etching. These processes may be used to customize a common non-leaded integrated circuit package to the required configuration, such as a single or multiple extensions formed at various locations around the die paddle, per the integrated circuit die. The extensions provide additional bonding sites for the integrated die to connect to ground. The additional bonding sites may potentially provide shorter bond length for the bond wires as well as alleviate congestions to bond the integrated circuit die to the outer and inner terminal pads, potentially resulting in an improved manufacturing yield of the non-leaded integrated circuit package system.

Another aspect of the present invention is the extensions not only provide additional bonding sites for the integrated circuit die, they also provide additional connection sites for the printed circuit board design. Ground connections from the printed circuit board to the non-leaded integrated circuit package system may be formed by connecting to the die paddle, any one of the extensions, the terminal pads, or a combination thereof. This connection flexibility provides an additional degree of freedom to minimize congestion of the printed circuit board, potentially resulting in an improved manufacturing yield, thermal dissipation, and electrical performance of the printed circuit board.

Yet another aspect of the present invention is that multiple ground planes may be provided while minimizing the printed circuit board congestion. The die paddle and the extensions may be connected to a particular ground plane, such as digital ground, of the printed circuit board. However, other ground planes, such as analog ground, may be connected to the terminals directed, as required.

Thus, it has been discovered that the non-leaded integrated circuit package system method of the present invention furnishes important and heretofore unknown and unavailable solutions, capabilities, and functional aspects for increasing input and output density in systems. The resulting processes and configurations are straightforward, cost-effective, uncomplicated, highly versatile and effective, can be implemented by adapting known technologies, and are thus readily suited for efficiently and economically manufacturing non-leaded integrated circuit packaged devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters set forth herein or shown in the accompanying drawings are to be interpreted in an illustrative and non-limiting sense.

What is claimed is:

1. A method for manufacturing a non-leaded integrated circuit package system comprising:
    forming a die paddle having peripheral sides joining to form paddle corners, and the die paddle having an extension extending orthogonally from an instance of the peripheral sides and between the paddle corners at opposing ends of the instance of the peripheral sides;
    forming outer terminal pads spaced away from the die paddle; and
    forming inner terminal pads spaced away from the die paddle and closer to the die paddle than the outer terminal pads with the extension extending between the inner terminal pads and not extending between the outer terminal pads.

2. The method as claimed in claim 1 further comprising forming the die paddle having a second extension extending therefrom adjacent the extension and having the inner terminal pads between the extension and the second extension and without having the outer terminal pads between the extension and the second extension.

3. The method as claimed in claim 1 further comprising forming the die paddle having a second extension and a third extension wherein the second extension and the third extension are on a different edge of the die paddle from the extension with the second extension and the third extension extending between the inner terminal pads and not extending between the outer terminal pads.

4. The method as claimed in claim 1 further comprising forming the die paddle having a second extension on a different edge of the die paddle from the extension with the second extension extending between the inner terminal pads and not extending between the outer terminal pads.

5. The method as claimed in claim 1 wherein forming the die paddle having the extension forms the extension at a corner of the die paddle.

6. A method for manufacturing a non-leaded integrated circuit package system comprising:
    forming a die paddle having peripheral sides joining to form paddle corners, and the die paddle having an extension extending orthogonally from an instance of the peripheral sides and between paddle corners at opposing ends of the instance of the peripheral sides;
    forming outer terminal pads spaced away from the die paddle; and
    forming inner terminal pads in a staggered arrangement from the outer terminal pads and closer to the die paddle than the outer terminal pads with the extension extending between the inner terminal pads and not extending between the outer terminal pads.

7. The method as claimed in claim 6 further comprising encapsulating an encapsulant around the die paddle, the extension, the outer terminal pads, and the inner terminal pads.

8. The method as claimed in claim 6 wherein forming the extension comprises forming additional ground bond sites for an integrated circuit die.

9. The method as claimed in claim 6 wherein forming the extension comprises forming multiple ground planes with the die paddle in conjunction with the extension are connected to one ground plane of a printed circuit board with the outer terminal pads and the inner terminal pads are connected to another ground plane of the printed circuit board.

10. The method as claimed in claim 6 wherein forming the extension comprises forming ground shielding for signals of the inner terminal pads between the extension.

11. A non-leaded integrated circuit package system comprising:
    a die paddle having a peripheral sides joining to form paddle corners, and the die paddle having an extension extending orthogonally from an instance of the peripheral sides and between paddle corners at opposing ends of the instance of the peripheral sides;

outer terminal pads spaced away from the die paddle; and inner terminal pads spaced away from the die paddle and closer to the die paddle than the outer terminal pads with the extension extending between the inner terminal pads and not extending between the outer terminal pads.

12. The system as claimed in claim 11 further comprising the die paddle having a second extension extending therefrom adjacent the extension with the inner terminal pads between the extension and the second extension and without having the outer terminal pads between the extension and the second extension.

13. The system as claimed in claim 11 further comprising the die paddle having a second extension and a third extension wherein the second extension and the third extension are on a different edge of the die paddle from the extension with the second extension and the third extension extending between the inner terminal pads and not extending between the outer terminal pads.

14. The system as claimed in claim 11 further comprising the die paddle having a second extension on a different edge of the die paddle from the extension with the second extension extending between the inner terminal pads and not extending between the outer terminal pads.

15. The system as claimed in claim 11 wherein the die paddle having the extension forms the extension on a corner of the die paddle.

16. The system as claimed in claim 11 wherein the inner terminal pads are in a staggered arrangement from the outer terminal pads.

17. The system as claimed in claim 16 further comprising an encapsulant around the die paddle, the extension, the outer terminal pads, and the inner terminal pads.

18. The system as claimed in claim 16 wherein the extension comprises additional ground bond sites for an integrated circuit die.

19. The system as claimed in claim 16 wherein the extension comprises multiple ground planes with the die paddle in conjunction with the extension are connected to one ground plane of a printed circuit board with the outer terminal pads and the inner terminal pads are connected to another ground plane of the printed circuit board.

20. The system as claimed in claim 16 wherein the extension comprises ground shielding for signals of the inner terminal pads between the extension.

\* \* \* \* \*